US009236275B2

(12) United States Patent
Yeh et al.

(10) Patent No.: US 9,236,275 B2
(45) Date of Patent: Jan. 12, 2016

(54) MEMS ACOUSTIC TRANSDUCER AND METHOD FOR FABRICATING THE SAME

(71) Applicant: INDUSTRIAL TECHNOLOGY RESEARCH INSTITUTE, Hsinchu (TW)

(72) Inventors: Chien-Nan Yeh, Tainan (TW); Chin-Hung Wang, Hsinchu (TW); Hsin-Li Lee, Hsinchu (TW); Jien-Ming Chen, Tainan (TW); Tzong-Che Ho, Tainan (TW); Li-Chi Pan, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 211 days.

(21) Appl. No.: 13/661,690

(22) Filed: Oct. 26, 2012

(65) Prior Publication Data

US 2013/0140655 A1    Jun. 6, 2013

(30) Foreign Application Priority Data

Dec. 1, 2011    (TW) .............................. 100144117 A
Jun. 8, 2012    (TW) .............................. 101120613 A

(51) Int. Cl.
*H01L 29/84*    (2006.01)
*H01L 21/56*    (2006.01)
(Continued)

(52) U.S. Cl.
CPC .............. *H01L 21/56* (2013.01); *B81B 7/0061* (2013.01); *H04R 31/006* (2013.01);
(Continued)

(58) Field of Classification Search
CPC ................. H04R 19/005; H04R 19/04; H04R 2201/003; H04R 29/84; B81B 2201/0257; B81B 2203/0127; B81C 1/00158; B81C 1/0023; B81C 1/00246

USPC ............ 257/E29.324, 415; 438/50; 381/174, 381/175
See application file for complete search history.

(56) References Cited

U.S. PATENT DOCUMENTS 6,178,249 B1 * 1/2001 Hietanen et al. .............. 381/174
6,667,560 B2   12/2003 Goh
(Continued)

FOREIGN PATENT DOCUMENTS

CN    101450786 A    6/2009
CN    202261791 U    5/2012
(Continued)

OTHER PUBLICATIONS

Chih-Hsiang Ko et al., "The EMI Suppression of Ultra Thin MEMS Microphone Package", Microsystems Packaging Assembly and Circuits Technology Conference (IMPACT), 2010 5th International, Date of Conference: Oct. 20-22, 2010, pp. 1-3.
(Continued)

*Primary Examiner* — Peter Bradford
(74) *Attorney, Agent, or Firm* — Muncy, Geissler, Olds & Lowe, P.C.

(57) ABSTRACT

A MEMS acoustic transducer is provided, which includes a substrate, a MEMS chip, and a housing. The substrate has a first opening area and a lower electrode layer disposed over a surface of the substrate, wherein the first opening area includes at least one hole allowing acoustic pressure to enter the MEMS acoustic transducer. The MEMS chip is disposed over the surface of the substrate, including a second opening area and an upper electrode layer partially sealing the second opening area, wherein the upper electrode layer and the lower electrode layer, which are parallel to each other and have a gap therebetween, form an induction capacitor. The housing is disposed over the MEMS chip or the surface of the substrate creating a cavity with the MEMS chip or the substrate. In addition, a method for fabricating the above MEMS acoustic transducer is also provided.

14 Claims, 11 Drawing Sheets

(51) Int. Cl.
   *B81B 7/00* (2006.01)
   *H04R 31/00* (2006.01)
   *H04R 19/00* (2006.01)

(52) U.S. Cl.
   CPC .. *B81B 2201/0257* (2013.01); *B81B 2207/012* (2013.01); *B81B 2207/096* (2013.01); *H01L 2224/48091* (2013.01); *H01L 2224/48137* (2013.01); *H01L 2224/73265* (2013.01); *H01L 2924/1461* (2013.01); *H01L 2924/3025* (2013.01); *H04R 19/005* (2013.01); *H04R 2499/11* (2013.01); *H04R 2499/15* (2013.01)

(56) References Cited

U.S. PATENT DOCUMENTS

| | | | |
|---|---|---|---|
| 6,781,231 B2 | 8/2004 | Minervini | |
| 6,876,071 B2 | 4/2005 | Liu et al. | |
| 6,924,429 B2 | 8/2005 | Kasai et al. | |
| 7,166,910 B2 | 1/2007 | Minervini | |
| 7,202,552 B2 | 4/2007 | Zhe et al. | |
| 7,242,089 B2 | 7/2007 | Minervini | |
| 7,314,816 B2 | 1/2008 | Liu et al. | |
| 7,381,589 B2 | 6/2008 | Minervini | |
| 7,388,281 B2 | 6/2008 | Krueger et al. | |
| 7,434,305 B2 | 10/2008 | Minervini | |
| 7,436,054 B2 | 10/2008 | Zhe | |
| 7,439,616 B2 | 10/2008 | Minervini | |
| 7,449,356 B2 | 11/2008 | Weigold | |
| 7,508,063 B2 | 3/2009 | Duboc et al. | |
| 7,537,964 B2 | 5/2009 | Minervini | |
| 7,544,540 B2 | 6/2009 | Bauer et al. | |
| 7,560,811 B2 | 7/2009 | Sakakibara et al. | |
| 7,560,857 B2 | 7/2009 | Chen et al. | |
| 7,576,415 B2 | 8/2009 | Cha et al. | |
| 7,607,355 B2 | 10/2009 | Shirasaka et al. | |
| 7,608,789 B2 | 10/2009 | Krüger et al. | |
| 7,633,156 B2 | 12/2009 | Minervini | |
| 7,646,092 B2 | 1/2010 | Saitoh et al. | |
| 7,692,288 B2 | 4/2010 | Zhe et al. | |
| 7,763,972 B2 | 7/2010 | Chien et al. | |
| 7,790,492 B1 | 9/2010 | Baumhauer, Jr. et al. | |
| 7,833,815 B2 | 11/2010 | Wang et al. | |
| 2005/0172996 A1 | 8/2005 | Hacke et al. | |
| 2005/0176164 A1 | 8/2005 | Gee et al. | |
| 2005/0185812 A1 | 8/2005 | Minervini | |
| 2006/0060238 A1 | 3/2006 | Hacke et al. | |
| 2006/0169049 A1 | 8/2006 | Matsubara | |
| 2007/0189558 A1* | 8/2007 | Ogura et al. | 381/191 |
| 2008/0092950 A1 | 4/2008 | Jimeno Cuesta et al. | |
| 2010/0019393 A1* | 1/2010 | Hsieh et al. | 257/777 |
| 2010/0060383 A1* | 3/2010 | Ward et al. | 333/186 |
| 2010/0071758 A1 | 3/2010 | Mueller et al. | |
| 2010/0155864 A1 | 6/2010 | Laming et al. | |
| 2010/0164025 A1* | 7/2010 | Yang | 257/416 |
| 2010/0183174 A1* | 7/2010 | Suvanto et al. | 381/174 |
| 2010/0284553 A1 | 11/2010 | Conti et al. | |
| 2011/0233692 A1 | 9/2011 | Inoda et al. | |
| 2013/0075835 A1* | 3/2013 | Chen et al. | 257/416 |
| 2013/0094675 A1* | 4/2013 | Je et al. | 381/174 |

FOREIGN PATENT DOCUMENTS

| | | |
|---|---|---|
| TW | 200534351 | 10/2005 |
| TW | 200729994 A | 8/2007 |
| TW | 201003805 | 1/2010 |
| TW | 201003876 | 1/2010 |
| TW | 201026086 A | 7/2010 |
| WO | WO 2007/126179 A1 | 11/2007 |

OTHER PUBLICATIONS

Winter, M. et al., "Chip Scale Package of a MEMS Microphone and ASIC Stack", Micro Electro Mechanical Systems (MEMS), 2010 IEEE 23rd International Conference on Date of Conference: Jan. 24-28, 2010, pp. 272-275.

Jiung-Yue Tien et al., "The development of a high performance, low cost package for MEMS Microphone package by using Lead-frame Land Grid Array (LLGA)", Microsystems, Packaging, Assembly Conference Taiwan, 2006. IMPACT 2006. International Date of Conference: Oct. 18-20, 2006, pp. 1-4.

Jian Cai et al., "A study on packaging of PZT MEMS microphone", Electronic Components and Technology Conference, 2005. Proceedings. 55th, Publication Year: 2005 , pp. 1077-1080 vol.2.

Taiwanese Office Action issued on Oct. 13, 2014 in corresponding patent application No. 101120613.

TW Office Action dated May 5, 2015.

* cited by examiner

MEMS ACOUSTIC TRANSDUCER AND METHOD FOR FABRICATING THE SAME

CROSS REFERENCE TO RELATED APPLICATIONS

This application claims priority of Taiwan Patent Application No. 100144117, filed on Dec. 1, 2011 and Taiwan Patent Application No. 101120613, filed on Jun. 8, 2012, the entirety of which is incorporated by reference herein.

TECHNICAL FIELD

The disclosure relates to a semiconductor device, and relates to a MEMS acoustic transducer and method of fabrication thereof.

BACKGROUND

With the increasing miniaturization of integrated circuits and the development of consumer electronic devices such as mobile phones, notebook and laptop computers, personal digital assistants, and digital cameras, the obvious market trend is toward making these devices lighter, thinner, and more compact. Thus, various electronic components should be manufactured and integrated into consumer electronic devices in such a way as to take up less space, yet provide more functions and improved performance. In the cell phone industry, smartphones in particular need to integrate various electronic components having a small volume, multi-functionality and low-cost properties in a specific volume, for example, integrating transmission mediums such as microphones with other communication devices.

Electric condenser microphones (hereinafter referred to as ECM), which are constructed using electret materials, are the most-often used microphones in consumer electronic devices. However, the ECM has been gradually replaced with a micro-electro-mechanical system acoustic transducer (hereinafter referred to as MEMS acoustic transducer). In general, both the ECM and the MEMS acoustic transducers detect sound by sensing the capacitance variation produced by acoustic pressure. In the ECM, a capacitor is formed of electret polymer membranes having eternal isolated charges for sensing the capacitance variation. In the MEMS acoustic transducer, there is a MEMS chip and an ASIC chip. The MEMS chip includes a capacitor formed of a membrane and a rigid through-hole back electrode on a silicon substrate for sensing the capacitance variation from the acoustic pressure, and the capacitance variation is processed by the ASIC chip. When comparing the ECM with the MEMS acoustic transducer, the latter may have a lot of advantages such as low cost, at least 30% of height reduction in its packaging structure, and resistance to degradation due to temperature, moisture, vibration, and general wear and tear. Moreover, the MEMS acoustic transducer is capable of being integrated with a band RF filter on ICs to reduce the interference produced by the RF, and the noise can be eliminated using arrays and algorithms. Thus, the MEMS acoustic transducer is especially suitable for RF applications such as cell phones and other devices that operate along similar principles, such as hearing aids, for example.

Thus, it is predicted that the MEMS acoustic transducer will largely replace the electret condenser microphones as the related technology continues to improve. Sensitivity is a key indicator of the MEMS acoustic transducer's effectiveness. Sensitivity is not only determined by a membrane in the MEMS chip, but is also determined by the volume of a back cavity. The volume of the back cavity is a closed volume behind the membrane and stands in contrast to the encountered acoustic pressure, which may provide a flexible recovery force to the membrane and can be used for tuning the acoustic resistive and response properties of the MEMS acoustic transducer. In addition, the fabrication process of the MEMS acoustic transducer is complicated, and therefore it is difficult to increase the sensitivity of the MEMS acoustic transducer while reducing production costs.

FIG. 1 shows a MEMS acoustic transducer packaging structure. In order to increase the volume of the back cavity 107 in a limited space, an interior housing 111 is added. The MEMS acoustic transducer includes a cavity 106 surrounded by a packaging substrate 102 and a housing 104. The housing 104 has a sound-opening 112 for receiving acoustic pressure. A MEMS acoustic transducer 116 and an application-specific integrated circuit (ASIC) chip 126 are disposed on the interior housing 111 within the cavity 106. The MEMS acoustic transducer 116 includes a silicon substrate 120, a membrane 118 (upper electrode), and a backplate (through-hole back electrode) 114 suspended below the membrane 118. The interior housing 111 and the packaging substrate 102 create the back cavity 107 of the MEMS acoustic transducer 116. Thus, the height of the back cavity 107 is similar to that of the MEMS acoustic transducer packaging structure when excluding of the height of the MEMS acoustic transducer 116, and therefore the volume of the back cavity 107 can be increased. However, there is still some space inside the packaging structure that cannot be used efficiently. In addition, the membrane 118 and the backplate 114 of the MEMS acoustic transducer 116 are two thin films which are hard to fabricate and easy to stick to each other. Thus, the MEMS acoustic transducer, as shown in FIG. 1, still cannot meet requirements of future applications.

SUMMARY

An embodiment of the disclosure provides a MEMS acoustic transducer, including: a substrate having a first opening area and a lower electrode layer disposed over a surface of the substrate, wherein the first opening area includes at least one hole allowing acoustic pressure to enter the MEMS acoustic transducer; a MEMS chip disposed over the surface of the substrate, including a second opening area and an upper electrode layer partially sealing the second opening area, wherein the upper electrode layer and the lower electrode layer, which are parallel to each other and have a gap therebetween, form an induction capacitor; and a housing disposed over the MEMS chip or the surface of the substrate, creating a cavity with the MEMS chip or the substrate.

An embodiment of the disclosure provides a method for fabricating a MEMS acoustic transducer, including: providing a substrate having a first opening area and a lower electrode layer disposed over a surface of the substrate, wherein the first opening area includes at least one hole allowing acoustic pressure to enter the MEMS acoustic transducer; mounting a MEMS chip over the surface of the substrate; and mounting a housing over the MEMS chip or the surface of the substrate to create a cavity with the MEMS chip or the substrate. The MEMS chip includes a second opening area and an upper electrode layer partially sealing the second opening area, wherein the upper electrode layer and the lower electrode layer, which are parallel to each other and have a gap therebetween, form an induction capacitor.

Another embodiment of the disclosure provides a MEMS acoustic transducer, including: a substrate having a indentation depressed from a surface of the substrate; a lower electrode layer disposed on the substrate and partially sealing the indentation to create a cavity; a MEMS chip having an opening area disposed over the surface of the substrate, wherein the opening area comprises at least one sound port allowing sound pressure to enter the MEMS acoustic transducer; and an upper electrode layer disposed on the opening area of the MEMS chip without covering the sound port, wherein the upper electrode layer and the lower electrode layer which are parallel to each other and have a gap therebetween form an induction capacitor.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
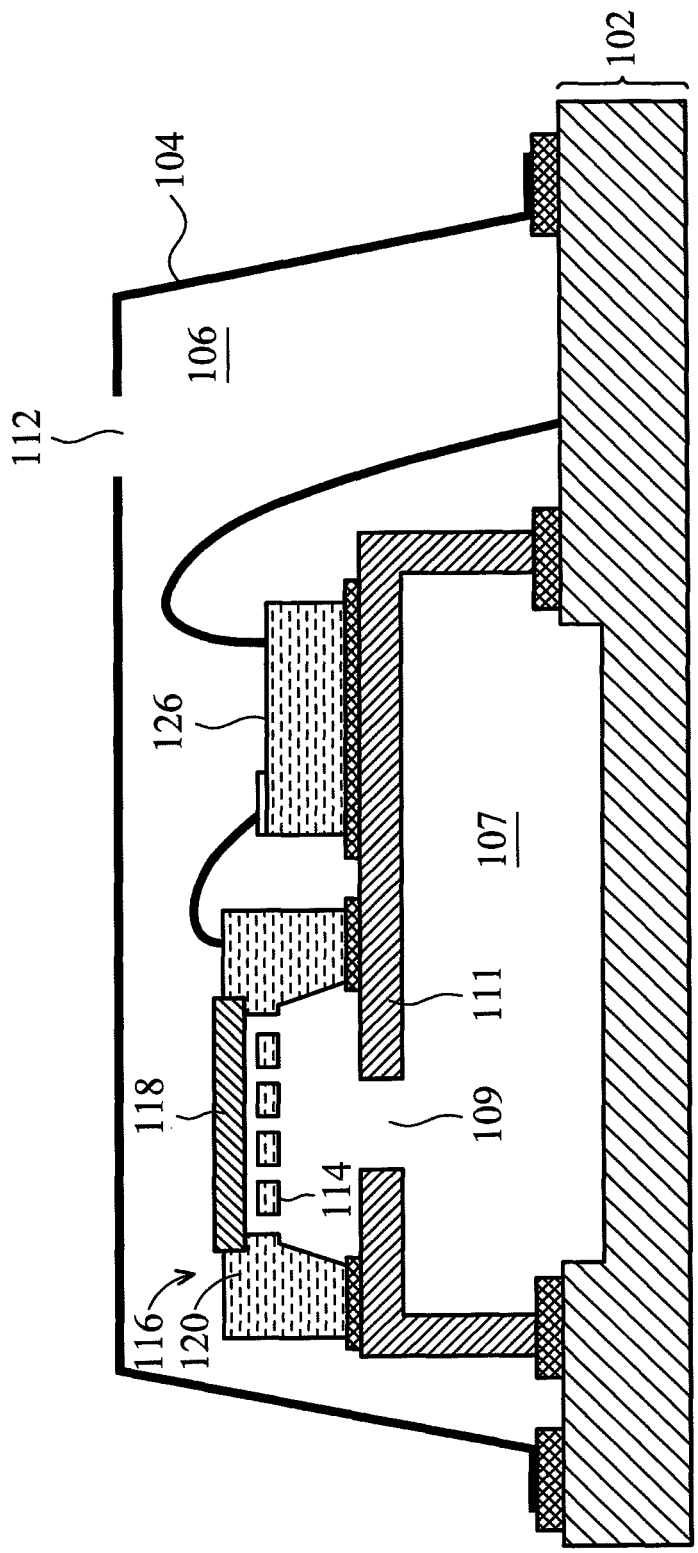
FIG. 1 shows a cross-sectional view of a MEMS acoustic transducer packaging structure.

The following description is of the best-contemplated mode of carrying out the disclosure. This description is made for the purpose of illustrating the general principles of the disclosure and should not be taken in a limiting sense. These are, of course, merely examples and are not intended to be limiting. In addition, the disclosure may repeat reference numerals and/or letters in the various examples. This repetition is for the purpose of simplicity and clarity and does not in itself dictate a relationship between the various embodiments and/or configurations discussed.

A micro-electro-mechanical systems acoustic transducer (MEMS acoustic transducer) and a method of fabrication thereof according to an embodiment of the disclosure are illustrated in the following description. The MEMS acoustic transducer may comprise a substrate having a first opening area and a MEMS chip having a second opening area. A lower electrode layer and an upper electrode layer are formed on the substrate and the MEMS chip, respectively, such that an induction capacitor is formed for sensing the acoustic pressure entering into the acoustic transducer.

Figure 2:
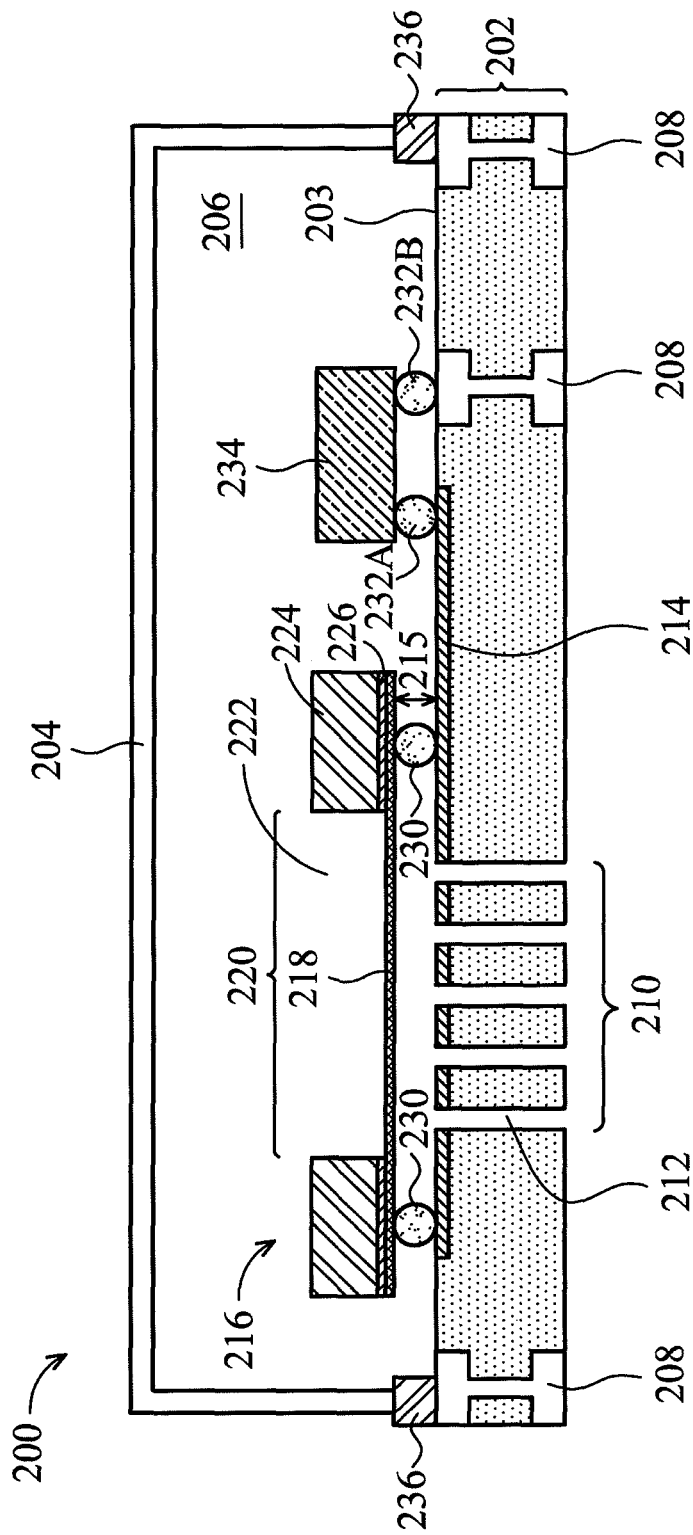
FIGS. 2 and 2A show a cross-sectional view and an exploded view, respectively, of a MEMS acoustic transducer according to an embodiment of the disclosure.
Figure 2A:
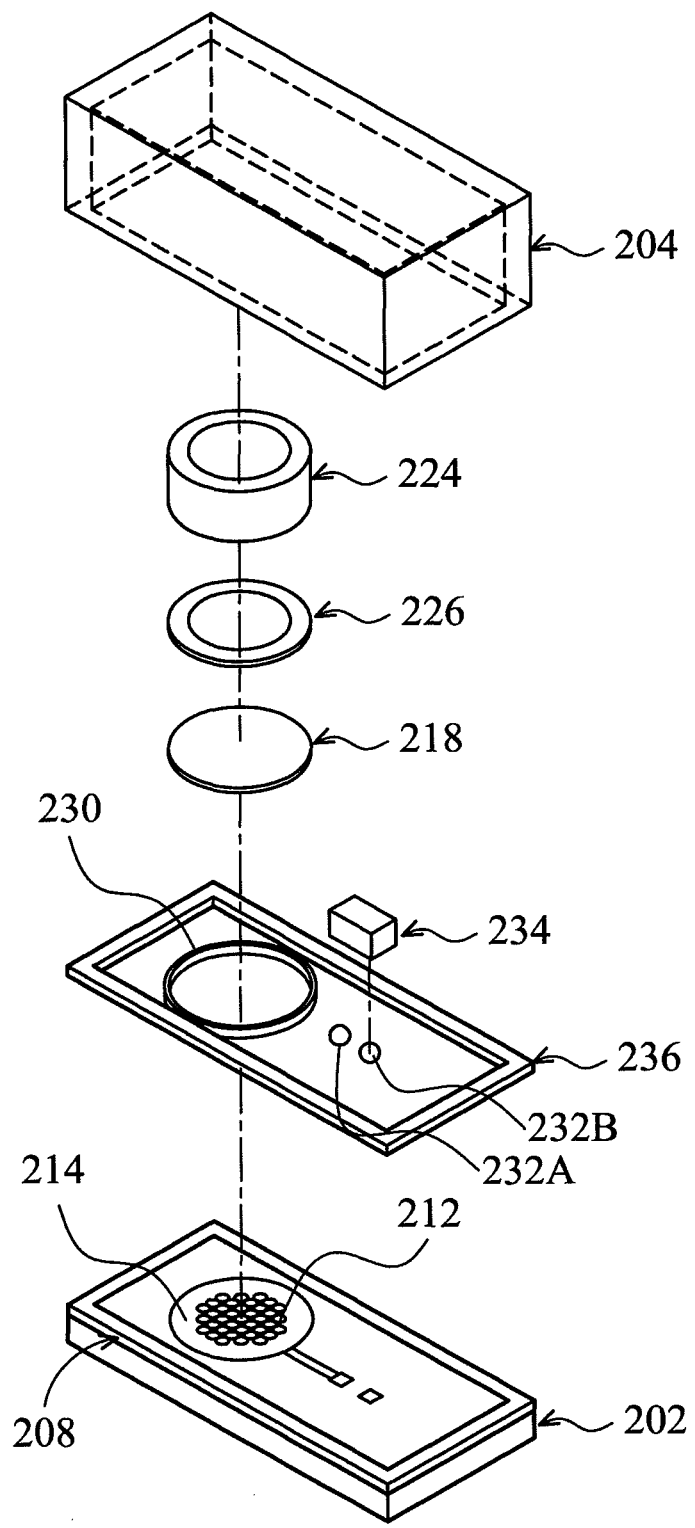

FIGS. 2 and 2A illustrate a cross-sectional view and an exploded view, respectively, of a MEMS acoustic transducer according to an embodiment of the disclosure. The MEMS acoustic transducer 200 may comprise a substrate 202 and a housing 204. The substrate 202 may be a porous packaging substrate. The substrate 202 may comprise a ceramic packaging substrate, a printed circuit board (PCB), a silicon substrate, or a plastic substrate having leadframes. The substrate 202 may comprise a plurality of conductive traces 208 electrically connected to outer circuits such as other PCBs or other large electronic devices or systems. The substrate 202 may comprise a first opening area 210. In an embodiment, the first opening area 210 may have at least one sound port 212, such as the plurality of sound ports as shown in FIGS. 2 and 2A. The sound port 212 may be a through hole through the substrate 202 for allowing the acoustic pressure outside the MEMS acoustic transducer to enter the MEMS acoustic transducer and be sensed. In an embodiment, the substrate 202 may have an aperture ratio of between about 30% and about 40%. The housing 204 may be disposed on a surface 203 of the substrate 202 to create a cavity 206 with the substrate 202. The housing 204 may be formed of conductive materials such as metal or plastic plated with metal, or ceramic materials plated with metal. The housing 204 may perform the function of shielding electromagnetic interference (EMI) and RF. In an embodiment, an anti-infrared coating or an anti-visible-light coating may be further coated on the housing 204.

The MEMS chip 216 may be disposed over the surface 203 of the substrate 202. The MEMS chip 216 may comprise an upper electrode layer 218, a semiconductor chip 224 and a dielectric layer 226 interposed therebetween. In one embodiment, two surfaces of the dielectric layer 226 are attached on a surface of the upper electrode layer 218 and a surface of the semiconductor layer 224, respectively. In addition, the MEMS chip 216 may further comprise a second opening area 220 aligned to the first opening area 210. The second opening area 220 may comprise at least one hole 222 through the semiconductor chip 224 and the dielectric layer 226. In this embodiment, the upper electrode layer 218 may be a vibration membrane disposed over the semiconductor chip 224 and may partially seal the second opening area 220. The vibration membrane may be a thin film comprised of polysilicon, metal, or other conductive materials, and may vibrate in response to the acoustic pressure. In an embodiment, the upper electrode layer 218 may be a porous membrane for reducing stress on itself. The semiconductor chip 224 may be a chip manufactured from a semiconductor wafer or a silicon-on-insulator (SOI) wafer. The dielectric layer 226 may comprise silicon oxide or other suitable dielectric materials.

The lower electrode layer 214 may be disposed on the surface 203 of the substrate 202. The lower electrode layer 214 may be a patterned conductive layer, for example, having the pattern shown in the FIG. 2A. In an embodiment, the lower electrode layer 214 may have a pattern including corresponding to the shape of MEMS chip 216 and covering the first opening area 210 of the substrate 202 and other areas, and the lower electrode layer 214 attached the substrate 202 but without sealing the sound port 212. In other words, the sound port 212 may penetrate through the substrate 202 and the lower electrode layer 214. Furthermore, the lower electrode layer 214 may also have a pattern corresponding to the circuit design, such as being directly or indirectly electrically connected to outer circuits via the conductive traces 208. The lower electrode layer 214 may comprise metal or any other conductive materials. In this embodiment, the lower electrode layer 214 may be a layer fixed on the surface 203 of the substrate 202, but it would not vibrate with the acoustic pressure. Thus, the lower electrode layer 214 may function as the backplate of the MEMS acoustic transducer. In addition, the lower electrode layer 214 may be parallel to the MEMS chip 216 with a vertical gap 215 (rather than zero) therebetween. In other words, in this embodiment, the upper electrode layer 218 and the lower electrode layer 214 of the MEMS acoustic transducer 200 may form the inductor capacitor (by using air as the capacitor dielectric), and the capacitance of the inductor capacitor may be determined from the overlapping area between the upper electrode layer 218 and the lower electrode layer 214 and the length of the vertical gap 215. In an embodiment, the capacitance of the inductor capacitor may also vary with the sizes and numbers of the sound port 212.

In an embodiment, an isolation element 230 may be disposed between the MEMS chip 216 and the surface 203 of the substrate 202 for providing the vertical gap 215 between the upper electrode layer 218 and the lower electrode layer 214. The isolation element 230 may be conductive glue. For example, the MEMS chip 216 may be electrically connected to the lower electrode layer 214, the conductive traces 208, and outer circuits via the conductive glue, or may electrically connect to conductive traces 208 and outer circuits via the conductive glue 232A and 232B under the ASIC chip 234. In this embodiment, the thickness of the isolation element 230 may determine the length of the vertical gap 215. The isolation element 230 may comprise a pattern surrounding the first opening area 210, such as an enclosed ring.

In an embodiment, the application-specific integrated circuit (ASIC) chip 234 may be fixed on the substrate 202 by the conductive glue 232A and 232B, and the ASIC chip 234 may have a gap or distance with the MEMS chip 216. For example, the ASIC chip 234 may be disposed on the substrate 202 and outside the first opening area 210. The ASIC chip 234 may comprise a front-end amplifier chip, analog/digital conversion integrated circuit, or another chip having similar functions. The ASIC chip 234 may have one end electrically connected to the MEMS chip 216 via the conductive glue 232A and the lower electrode layer 214 for receiving the capacitance variation detected by the MEMS chip 216. In addition, the ASIC chip 234 may have another end electrically connected to the conductive traces 208 through the conductive glue 232B. The isolation element 230, the conductive glue 232A and 232B may comprise silver glue, solder ball, or other surface mounting technologies. The conductive glue 232A and 232B, and the isolation element 230 may have the same or different thickness.

In another embodiment, the ASIC chip 234 and the MEMS chip 216 may be fabricated together using CMOS processes. The ASIC chip 234 may be integrated into the semiconductor chip 224 of the MEMS chip 216 for forming system-on-chip (SOC). In other embodiments, the ASIC chip 234 may also be integrated into the substrate 202. Thus, the total volume of the MEMS acoustic transducer 200 may be further reduced.

In an embodiment, the housing 204 may be fixed on the surface 203 of the substrate 202 and be electrically connected to the conductive trace 208 in the substrate 202 via a conductive glue 236. The conductive glue 236 may comprise silver glue, solder ball, or other surface mounting technologies.

During the operation of the MEMS acoustic transducer 200, the outside acoustic pressure may enter the cavity 206 of the MEMS acoustic transducer 200 via the sound port 212 of the first opening area 210 of the substrate 202, and the upper electrode layer 218 of the MEMS chip 216 may have a responsive vibration such that the capacitance between the upper electrode layer 218 and the lower electrode layer 214 may vary with the vibration. The capacitance variation may be received and processed by the MEMS chip 216 and the ASIC chip 234. When compared to the conventional MEMS acoustic transducer in which the membrane (upper electrode) and the backplate (lower electrode) of the conventional MEMS acoustic transducer are both formed in the MEMS chip, the lower electrode layer 214 of the MEMS acoustic transducer 200 is on the substrate 202 and directly functions as the backplate. Thus, it may be omitted conductive layer which can form the induction capacitor with the upper electrode layer 218 existing in the MEMS chip 216 of the MEMS acoustic transducer 200. The capacitor configured to sense the acoustic pressure change is formed of the upper electrode layer 218 in the MEMS chip 216 and the lower electrode layer 214 on the substrate 202. In addition, the vertical gap 215 between the upper electrode layer 218 and the lower electrode layer 214 may be adjusted to be large enough by means of the isolation element 230, and the sticking problems may be therefore overcome.

Figure 3:
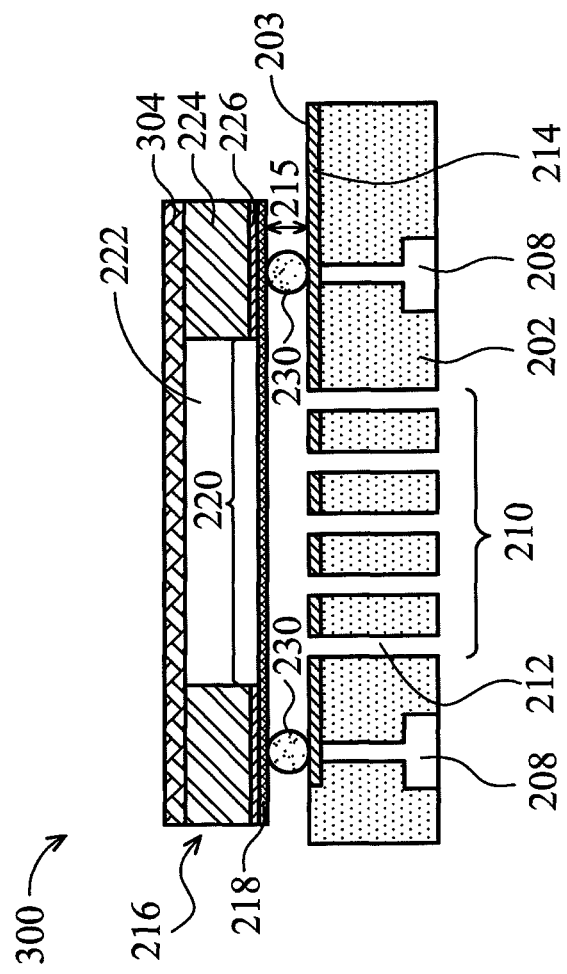
FIGS. 3-7 show cross-sectional views of MEMS acoustic transducers according to many embodiments of the disclosure.

FIG. 3 shows a cross-sectional view of a MEMS acoustic transducer 300 according to another embodiment of the disclosure. In this embodiment, the same reference numeral represents the same or similar materials or forming methods described in the above embodiments. Thus, some features which have been described above will not be further discussed in the following. In this embodiment, the main difference from the above embodiment is that the housing is directly disposed on the MEMS chip.

Referring to FIG. 3, the MEMS acoustic transducer 300 may comprise a substrate 202 and a MEMS chip 216 disposed thereof. The MEMS chip 216 may comprise a semiconductor chip 224, a dielectric layer 226 and an upper electrode layer 218. The substrate 202 may have a lower electrode layer 214 disposed on the surface 203 of the substrate 202, without sealing the sound port 212. In this embodiment, the upper electrode layer 218 may be a vibration membrane which may vibrate in response to the acoustic pressure, and the lower electrode layer 214 may be a rigid layer fixed on the surface 203 of the substrate 202. The upper electrode layer 218 and the lower electrode layer 214 may be parallel to each other and have a vertical gap 215 therebetween. The vertical gap 215 may have a cylindrical shape such that the acoustic pressure may force to the upper electrode layer 218 (vibration membrane) through the sound port 212 and the vertical gap 215.

In this embodiment, the housing 304 may be directly disposed on a side of the semiconductor chip 224 opposite to another side of the semiconductor chip 224 facing the upper electrode layer 218. The housing 304 may seal a side of the hole or holes 222 of the second opening area 220 opposite to another side of the hole or holes 222 of the second opening area 220 facing the upper electrode layer 218. Thus, a cavity is created by the housing 304, the MEMS chip 216, and the upper electrode layer 218. In other words, the hole or holes 222 in the MEMS chip 216 and the dielectric layer 226 may be the cavity which serves as the back cavity of the MEMS acoustic transducer 300. In an embodiment, the housing 304 may be formed of polyimide.

In an embodiment, the ASIC chip (not shown) and the MEMS chip 216 may be fabricated together using CMOS processes. The ASIC chip may be integrated into the semiconductor chip 224 of the MEMS chip 216 for forming system-on-chip (SOC). In another embodiment, the ASIC chip also disposed in the substrate 202.

It is understood that, in this embodiment, the acoustic pressure may enter the MEMS acoustic transducer 300 from the backside of the substrate 202 and through the sound port 212 of the first opening area 210. In addition, since the housing 304 is directly disposed on the MEMS chip 216, the at least one hole 222 may serve as the back cavity of the MEMS acoustic transducer 300. Accordingly, the MEMS acoustic transducer 300 may have a reduced total thickness. The MEMS acoustic transducer 300 is not only in prone to the light-thinning trend, but also has a high sensitivity which would not be sacrificed with reduced volume. In addition, the volume of the back cavity is determined by the MEMS chip and would not be limited by the thickness of the substrate. Therefore, for the same structures or elements is not repeat again here.

Figure 4:
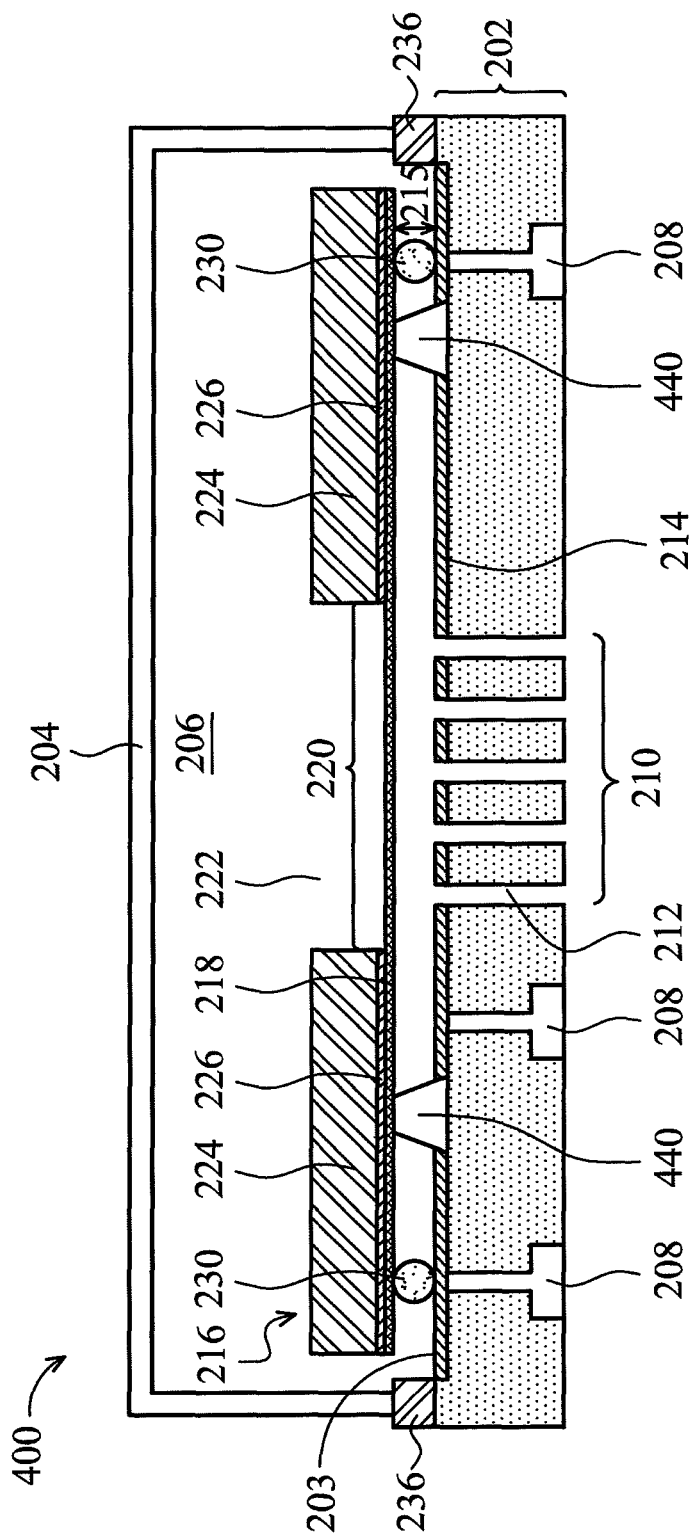

FIG. 4 shows a cross-sectional view of a MEMS acoustic transducer 400 according to another embodiment of the disclosure. In this embodiment, the same reference numeral represents the same or similar materials or forming methods described in the above embodiments. Thus, some features which have been described above will not be further discussed in the following. In this embodiment, the main difference from the above embodiment is that the isolation elements are provided by the substrate.

Referring to FIG. 4, the MEMS acoustic transducer 400 may comprise a substrate 202 and a MEMS chip 216 disposed thereon. An upper electrode layer 218 may be disposed on a lower side of the MEMS chip 216. A lower electrode layer 214 may be disposed on a surface 203 of the substrate 202, without sealing the sound port 212 of the first opening area 210. In this embodiment, the upper electrode layer 218 may be a vibration membrane which may vibrate in response to the sound pressure, and the lower electrode layer 214 may be a rigid layer fixed on the surface 203 and the substrate 202.

In this embodiment, an isolation element 440 may be formed on the substrate 202. The isolation element 440 may have the same material with the substrate 202, such as ceramic packaging materials, PCB materials or plastic materials having leadframes. The isolation element 440 and the substrate 202 may be fabricated by the same or different processes. For example, the isolation element 440 and the substrate 202 are an integrated unibody. In an embodiment, the ASIC chip (not shown) may also be integrated in the substrate 202. Alternatively, the ASIC chip (not shown) and the MEMS chip 216 may be fabricated together using CMOS processes and the ASIC chip is integrated into the MEMS chip 216 with the semiconductor chip 224 for forming system-on-chip (SOC).

The isolation element 440 may have a height for providing the vertical gap 215 between the MEMS chip 216 and the substrate 202. The vertical gap 215 may have a distance disposed between the upper electrode layer 218 of the MEMS chip 216 and the lower electrode layer 214 of the substrate 202. Conductive glue 230 may be injected into the vertical gap 215. In comparison to the above embodiments in which the height of the vertical gap 215 is achieved by using the conductive glue, controlling the vertical gap 215 by means of the isolation element 440 may be easier and more accurate. In addition, the overlapping area of a pattern of the lower electrode layer 214 and the upper electrode layer 218 may also vary by the horizontal disposition of the isolation element 440. Thus, the MEMS acoustic transducer 400 may be fabricated by an easier process. As such, the capacitance of the inductor capacitor and the MEMS acoustic transducer 400 may have higher accuracy. In addition, the vertical gap 215 between the upper electrode layer 218 and the lower electrode layer 214 may be also tuned to be large enough by means of the isolation elements 440, and sticking problems may be therefore overcome. The isolation element 440 may be an enclosed ring such that the acoustic pressure may force to the upper electrode layer 218 (vibration membrane) through the sound port 212.

Moreover, the housing 204 may be directly attached on the upper side of the MEMS chip 216, and the following embodiments may also vary with similar structures.

Figure 5:
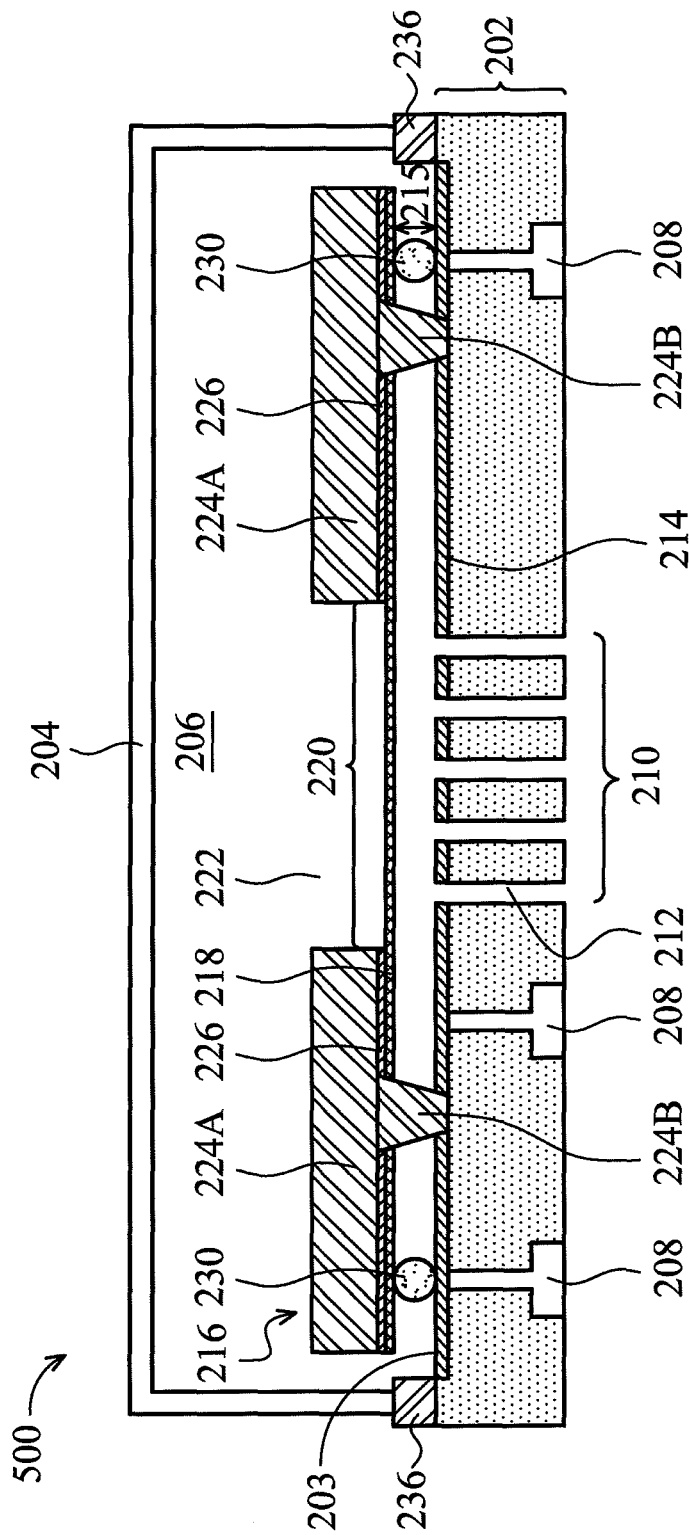

FIG. 5 shows a cross-sectional view of a MEMS acoustic transducer according to a further embodiment of the disclosure. In this embodiment, the same reference numerals represent the same or similar materials or forming methods described in the above embodiments. Thus, some features which have been described above will not be further discussed in the following. In this embodiment, the main difference from the above embodiments is that the MEMS chip may have an extension portion for providing the vertical gap between the upper and lower electrode layers.

Referring to FIG. 5, the MEMS acoustic transducer 500 may include a substrate 202 and a MEMS chip 216 disposed thereon. The MEMS chip 216 may comprise an upper electrode layer 218, a semiconductor chip and a dielectric layer 226. The semiconductor chip may comprise a main portion 224A and an extension portion 224B extending outwardly from the main portion 224A. The main portion 224A and the extension portion 224B of the semiconductor chip may be formed from a silicon substrate. For example, the main portion 224A and the extension portion 224B of the semiconductor chip may be formed from the same silicon substrate and have the desired shapes and thicknesses by using lithography processes. In an embodiment, the main portion 224A and the extension portion 224B of the semiconductor chip may be an integrated unibody. In other embodiments, the extension portion 224B of the MEMS chip 216 may be a silicon oxide layer on the main portion 224A formed by thermal oxide. The extension portion 224B may have a ring shape. The upper electrode layer 218 may be formed on the main portion 224A of the semiconductor chip 224 and be surrounded by the extension portion 224B. A lower electrode layer 214 may be formed on a surface 203 of the substrate 202, without sealing the sound ports 212 of a first opening area 210. In this embodiment, the upper electrode layer 218 may be a vibration membrane which may vibrate in response to the sound pressure, and the lower electrode layer 214 may be a rigid layer fixed on the surface 203 of the substrate 202. The upper electrode layer 218 and the lower electrode layer 214 may be parallel to each other and have a vertical gap 215 therebetween. In an embodiment, the ASIC chip (not shown) and the MEMS chip 216 may be formed together by using CMOS processes, and therefore the ASIC chip may be integrated into a semiconductor chip of the MEMS chip 216 for forming system-on-chip (SOC). In other embodiments, the ASIC chip may be integrated into the substrate 202.

The extension portion 224B of the MEMS chip 216 may have a height for providing the vertical gap 215 between the upper electrode layer 218 on the main portion 224A of the semiconductor chip and the lower electrode layer 214 on the substrate 202, when mounting the MEMS chip 216 onto the substrate 202. Conductive glue 230 may be injected form the vertical gap 215. In comparison to the above embodiments in which the height of the vertical gap is determined by using conductive glue, controlling the vertical gap 215 by means of the extension portion 224B of the semiconductor chip may be easier and more accurate. In addition, the overlapping area of the lower electrode layer 214 and the upper electrode layer 218 may be also varied by the horizontal disposition of the extension portion 224B of the MEMS chip 216 such that the capacitance may be tuned with high accuracy. As such, the accuracy of the MEMS acoustic transducer may be therefore improved. In addition, the MEMS acoustic transducer 500 may be fabricated by an easier process since the extension portion 224B may be fabricated within the fabrication of the MEMS chip. The vertical gap 215 between the upper electrode layer 218 and the lower electrode layer 214 may be tuned to be large enough by means of the extension portion 224B of the MEMS chip 216, and sticking problems may be therefore avoided. Further, the housing 204 can also attach over an upper side of the MEMS chip 216.

Figure 6:
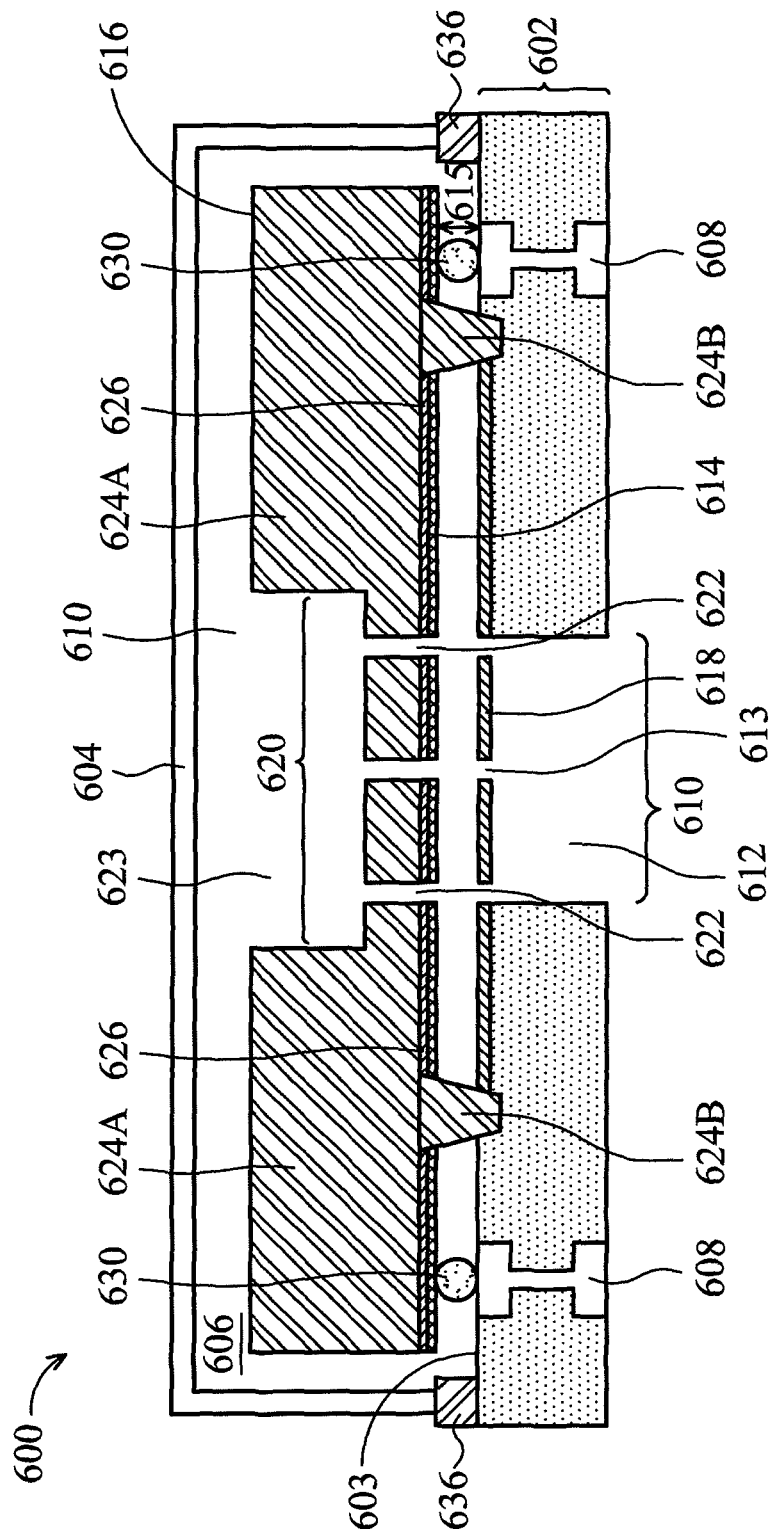

FIG. 6 shows a cross-sectional view of a MEMS acoustic transducer 600 according to an alternative embodiment of the disclosure. In this embodiment, the same reference numeral represents the same or similar materials or forming methods described in the above embodiments. Thus, some features which have been described above will not be further discussed in the following.

The MEMS acoustic transducer 600 may comprise a substrate 602 and a housing 604. The housing 604 may be disposed on the substrate 602 creating a cavity 606 with the substrate 602. The substrate 602 may be a porous packaging substrate. The substrate 602 may comprise a ceramic packaging substrate, a printed circuit board, a silicon substrate, or a plastic substrate having leadframes. The substrate 602 may have a plurality of conductive traces 608 for electrically connecting to other PCBs or other larger electronic devices or systems. The substrate 602 may comprise a first opening area 610. In an embodiment, the first opening area 610 may comprise at least one hole 612. A lower electrode layer 618 may be disposed on the substrate 602. The lower electrode layer 618 may be a porous vibration membrane which may vibrate in response to the sound pressure. The lower electrode layer 618 may have a plurality of holes 613 for reducing stress on itself and allowing outer sound pressure entering the MEMS acoustic transducer 600. In an embodiment, the lower electrode layer 618 may be formed of polysilicon, metal or other conductive materials.

A MEMS chip 616 may be disposed on a surface 603 of the substrate 602. The MEMS chip 616 may comprise a second opening area 620 substantially aligned to the first opening area 610. The second opening area 620 may comprise a hollow portion 623 and at least one through hole 622 through the MEMS chip 616. The hollow portion 623 may be extended from a surface of the MEMS chip 616 to an inter-level of the MEMS chip 616, but does not penetrate through the MEMS chip 616. The hollow portion 623 may provide more volume for the back cavity. The at least one through hole 622 may be extended from a bottom of a hollow portion 623. The MEMS chip 616 may be fabricated from a semiconductor wafer or a silicon-on-insulator wafer. For example, the MEMS chip 616 may comprise a semiconductor chip having a main portion 624A and an extension portion 624B, a dielectric layer 626 and an upper electrode layer 614. The dielectric layer 626 may be disposed between the upper electrode layer 614 and the main portion 624A of the MEMS chip 616. The main portion 624A and the extension portion 624B of the semiconductor chip may be formed from a silicon substrate. The extension portion 624B of the semiconductor chip may be outwardly extended from the main portion 624A such that a gap may be formed from the substrate 602 to the main portion 624A of the semiconductor chip and the upper electrode layer 614, when mounting the MEMS chip 616 onto the substrate 602. In an embodiment, the main portion 624A and the extension portion 624B of the semiconductor chip may be formed together from the same silicon substrate using COMS processes. In other embodiments, the extension portion 624B of the semiconductor chip may be a silicon oxide layer on the main portion of 624A formed by thermal oxide. The dielectric layer 626 may comprise silicon oxide or other dielectric materials.

The upper electrode layer 614 may be disposed on the main portion 624A of the semiconductor chip. For example, in this embodiment, the upper electrode layer 614 may be disposed on the main portion 624A of the MEMS chip 616, without sealing the through holes 622. Note that, in this embodiment, the upper electrode layer 614 may be a rigid layer fixed on the surface of the MEMS chip 616 but that does not vibrate with the sound pressure, so that the upper electrode layer 614 may serve as the backplate of the MEMS acoustic transducer 600.

The lower electrode layer 618 on the substrate 602 and the upper electrode layer 614 on the MEMS chip 616 may be parallel to each other and have a vertical gap 615 therebetween. Thus, the lower electrode layer 618 and the upper electrode layer 614 over the lower electrode layer 618 may form an induction capacitor (by using air as the capacitor dielectric), and the capacitance may be determined by the overlapping area of the upper and lower electrode layers and the length of the vertical gap 615. In an embodiment, the length of the vertical gap 615 may be determined by the thickness of the extension portion 624B of the MEMS chip 616. In addition, the capacitance of the induction capacitor may also vary with the sizes and numbers of the through holes 622.

In an embodiment, the ASIC chip (not shown) and the MEMS chip 616 may be formed together by using CMOS processes, and therefore the ASIC chip may be integrated into the main portion 624A of semiconductor chip for forming system-on-chip (SOC). In other embodiments, the ASIC chip may be also integrated into the substrate 602. Thus, the MEMS acoustic transducer 600 may have a reduced volume. In an embodiment, an conductive glue 630 may be injected into the vertical gap 615 between the upper electrode layer 614 and the substrate 602 for transmitting signals of the MEMS chip 616 to outer circuits. In an embodiment, the housing 604 may be mounted onto the surface 603 of the substrate 602 by the conductive glue 636. The conductive glue 630 and 636 may comprise silver glue, solder balls, or other surface mount technologies. Furthermore, in an embodiment, the housing 604 may be directly disposed onto the MEMS chip 616, similar with the housing 304 shown in FIG. 3.

In summary, during the operation of the MEMS acoustic transducer 600, the sound pressure outside the cavity 606 may enter the cavity 606 of the MEMS acoustic transducer 600 via the holes 612 and 613 of the first opening area 610 of the substrate 602. The lower electrode layer 618 may vibrate corresponding to the sound pressure, resulting in a capacitance variation between the upper electrode layer 614 and the lower electrode layer 618. The capacitance variation may be received and processed by the MEMS chip 616 and the ASIC chip. Thus, there is no other conductive layer which can form the induction capacitor with the upper electrode layer 614 existing in the MEMS chip 616 of the MEMS acoustic transducer 600 according to the disclosure. The induction capacitor capable of sensing the changes of the sound pressure may be formed from the lower electrode layer 618 on the substrate 602 and the upper electrode layer 614 on the MEMS chip 616.

Figure 7:
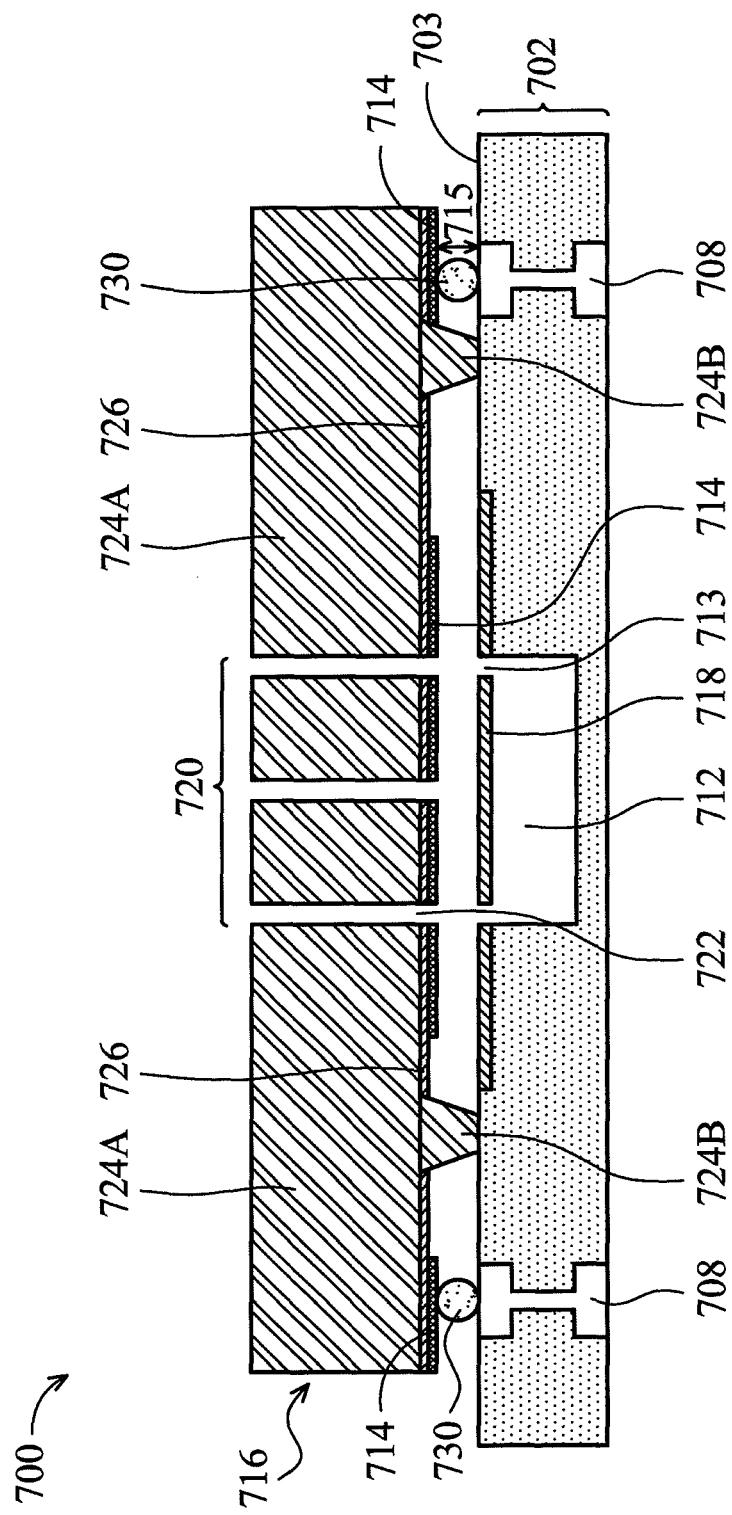

FIG. 7 shows a cross-sectional view of a MEMS acoustic transducer 700 according to another alternative embodiment of the disclosure. In this embodiment, the same reference numerals represent the same or similar materials or forming methods described in the above embodiments. Thus, some features which have been described above will not be further discussed in the following.

The MEMS acoustic transducer 700 may comprise a substrate 702, such as a porous packaging substrate. The substrate 702 may comprise a ceramic packaging substrate, a printed circuit board substrate, a silicon substrate, or a plastic substrate having leadframes. The substrate 702 may have a plurality of conductive traces 708 for electrically connecting to PCB or other larger electronic devices or systems. The substrate 702 may comprise a indentation 712 depressed from a surface 703 of the substrate 702.

A MEMS chip 716 may be disposed on the surface 703 of the substrate 702. The MEMS chip 716 may comprise an opening area 720 substantially aligned to the indentation 712. The opening area 720 may comprise at least one through hole 722 through the MEMS chip 716. The through hole 722 may be a sound port allowing the outside sound pressure to enter the MEMS acoustic transducer 700 to be sensed. The MEMS chip 716 may be fabricated from a semiconductor wafer or a silicon-on-insulator wafer. For example, the MEMS chip 716 may comprise a semiconductor chip having a main portion 724A and an extension portion 724B, a dielectric layer 726 and an upper electrode layer 714. The dielectric layer 726 may be disposed between the upper electrode layer 714 and the main portion 724A. In an embodiment, the extension portion 724B of the semiconductor chip may be outwardly extended from the main portion 724A such that a gap may be formed from the substrate 702 to the main portion 724A of the semiconductor chip and the upper electrode layer 714. The main portion 724A and the extension portion 724B of the semiconductor chip may be fabricated together from the same silicon substrate using CMOS processes. In an embodiment, the extension portion 724B of the semiconductor chip may be a silicon oxide layer on the main portion 724A formed by thermal oxide. The dielectric layer 726 may comprise silicon oxide or other dielectric materials.

The upper electrode layer 714 may be disposed on a lower side of the main portion 724A of the semiconductor chip. For example, in this embodiment, the upper electrode layer 714 and the dielectric layer 726 may be disposed on the main portion 724A of the semiconductor chip. The upper electrode layer 714 and the dielectric layer 726 may have a portion located in the opening area 720, without sealing the sound port. The upper electrode layer 714 may be a rigid layer fixed on the surface of the MEMS chip 716 but does not vibrate with the sound pressure, for serving as the backplate of the MEMS acoustic transducer 700.

The lower electrode layer 718 may be disposed on the substrate 702. For example, in this embodiment, the lower electrode layer 718 may be directly disposed on the substrate 702 and partially seal the opening of the indentation 712. The lower electrode layer 718 may be a vibration membrane which may vibrate in response to the sound pressure that enters via the though holes 722. In addition, the lower electrode layer 718 may have a plurality of holes 713 for reducing stress on itself. The lower electrode layer 718 may be formed of polysilicon, metal, and other conductive materials. Furthermore, the lower electrode layer 718 the upper electrode layer 714 may be parallel to each other and have a vertical gap 715 therebetween. Thus, the lower electrode layer 718 and the upper electrode layer 714 over the lower electrode layer 718 may form an induction capacitor (by using air as the capacitor dielectric), and the capacitance may be determined by the overlapping area of the upper and lower electrode layers and the length of the vertical gap 715. The length of the vertical gap 715 may be determined by the thickness of the extension portion 724B of the MEMS chip 716. In this embodiment, the indentation 712 may serve as the back cavity of the MEMS acoustic transducer 700. Therefore, the volume of the back cavity may be determined by the size of the indentation 712.

In an embodiment, the ASIC chip (not shown) and the MEMS chip 716 may be formed together by using CMOS processes, and therefore the ASIC chip may be integrated into the main portion 724A of the semiconductor chip for forming system-on-chip (SOC). In other embodiments, the ASIC chip may be integrated into the substrate 702. Thus, the MEMS acoustic transducer 700 may have a reduced volume. In an embodiment, an conductive glue 730, such as conductive glue, may be injected into the vertical gap 715 between the MEMS chip 716 and the substrate 702 for transmitting signals of the MEMS chip 716 to outer circuits.

In summary, during the operation of the MEMS acoustic transducer 700, the outside sound pressure may enter the MEMS acoustic transducer 700, such as entering the indentation 712, via the though holes 722 of the opening area 720 of the MEMS chip 716. Thus, a housing is unnecessary for the MEMS acoustic transducer 700. The cavity created by the housing and the substrate in other embodiments may be directly replaced by the indentation 712. The lower electrode layer 718 of the MEMS chip 716 may vibrate in response to the entered sound pressure resulting in a capacitance variation between the upper electrode layer 714 and the lower electrode layer 718. The capacitance variation may be received and processed by the MEMS chip 716 and the ASIC chip. Thus, there is no conductive layer which can form the induction capacitor with the upper electrode layer 714 existing in the MEMS chip 716 of the MEMS acoustic transducer 700 according to the disclosure. The induction capacitor capable of sensing the changes of the sound pressure may be formed from the lower electrode layer 718 and the upper electrode layer 714 on the MEMS chip 716.

Figure 8A:
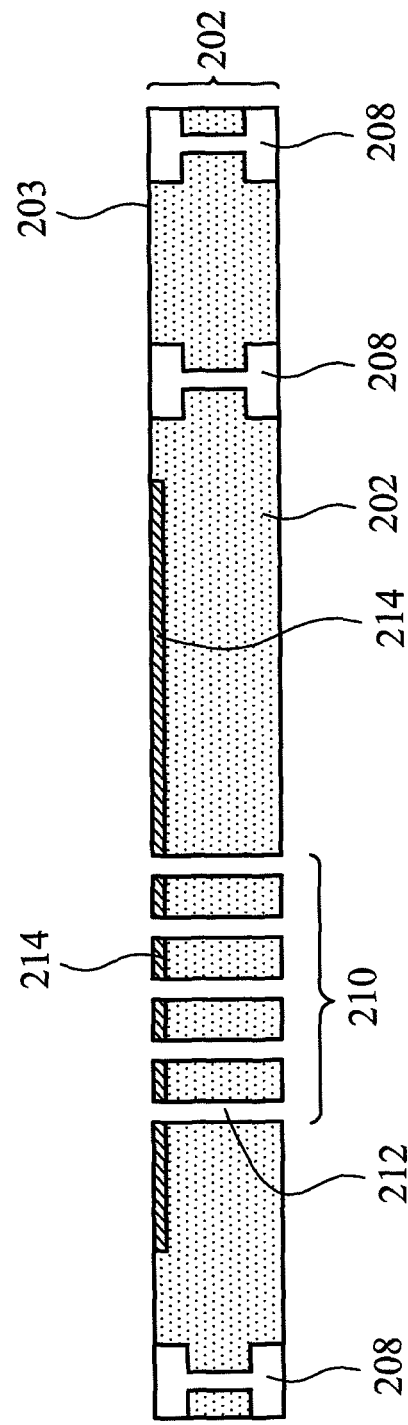
FIGS. 8A through 8C show cross-sectional views of a method for fabricating a MEMS acoustic transducer at various stages according to an embodiment of the disclosure.
Figure 8B:
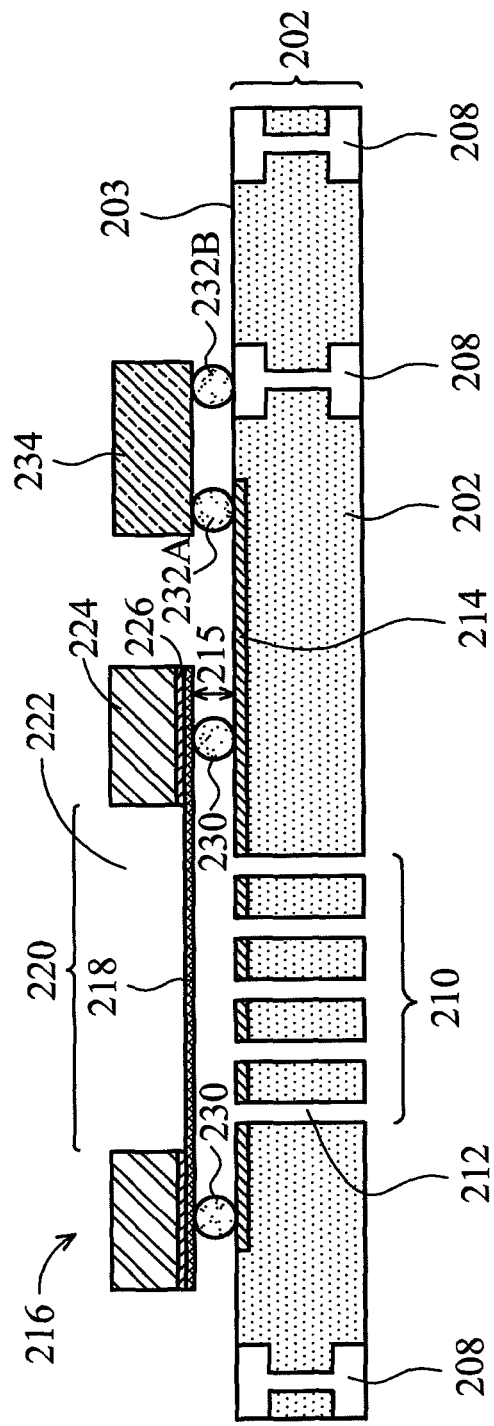
Figure 8C:
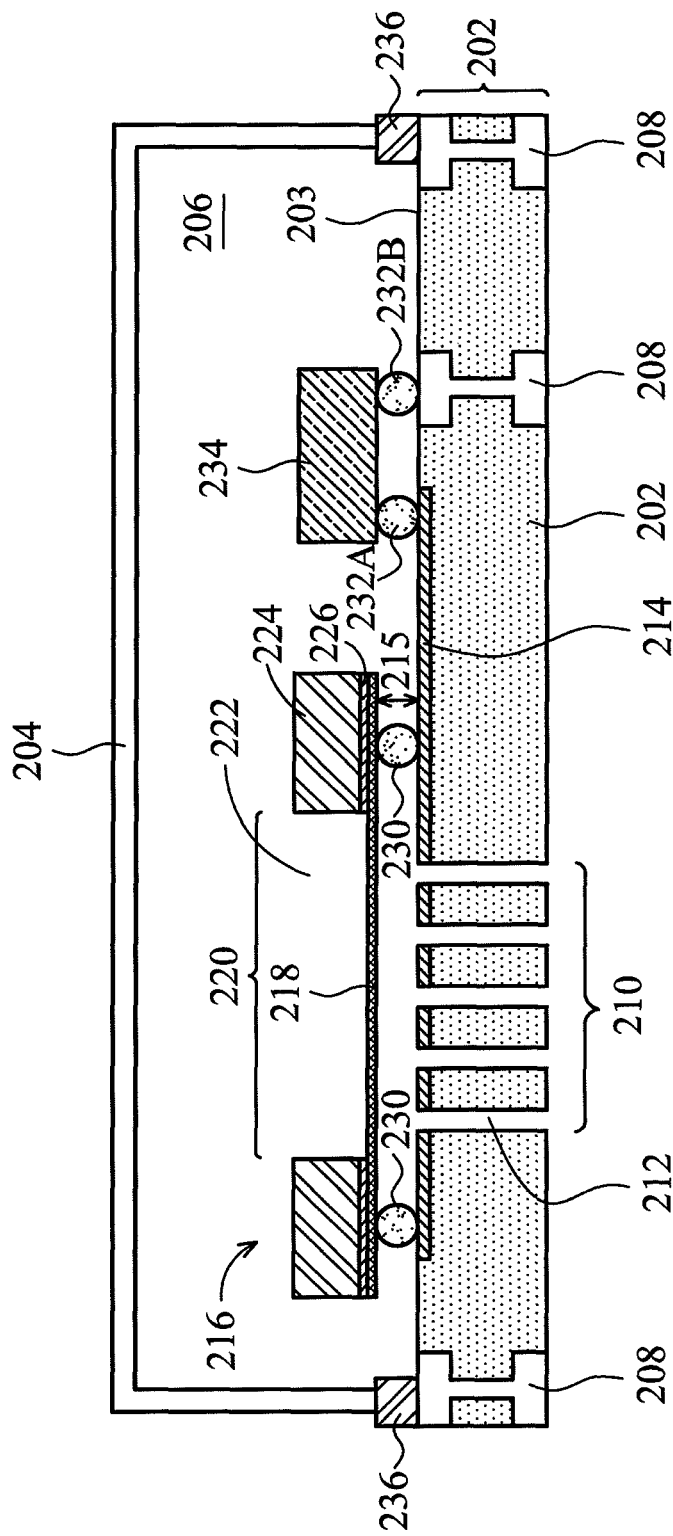

FIGS. 8A~8C show cross-sectional views of a method of fabricating a MEMS acoustic transducer at various stages according to an embodiment of the disclosure. FIGS. 8A~8C illustrate the method for fabricating the MEMS acoustic transducer 200 shown in FIG. 2, however, one skilled in the art can understand that similar concepts may also apply to other embodiments of the disclosure. In this embodiment, the same reference numerals represent the same or similar materials or forming methods described in the above embodiments.

Referring to FIG. 8A, a substrate 202 is provided first. The substrate 202 may comprise an opening area 210. In an embodiment, the opening area 210 may comprise one or more sound port 212. The sound port 212 may be formed by a $CO_2$ laser, UV-YAG laser, or other laser micro-drilling method. In addition, the substrate 202 may have a patterned lower electrode layer 214 disposed on a surface 203 of the substrate 202. The substrate 202 may comprise a plurality of conductive traces 208 for electrically connecting to outer circuits. For example, the conductive traces 208 may be a through substrate via (TSV). As described above, the lower electrode layer 214 may have a pattern as shown in FIG. 2A, which comprises a pattern including corresponding to the shape of MEMS chip 216 and covering the opening area 210 of the substrate 202 and other areas, without sealing the sound port 212.

Then, as shown in FIG. 8B, the MEMS chip 216 and the ASIC chip 234 are mounted on the substrate 202. The MEMS chip 216 may be aligned to the first opening area 210 of the substrate 202 and mounted thereon using the conductive glue 230. Thus, the MEMS chip 216 may be electrically connected to the lower electrode layer 214 via the conductive glue 230. In an embodiment, the ASIC chip 234 and the MEMS chip 216 may be separately mounted on the substrate 202. For example, the ASIC chip 234 may have one end electrically connected to the MEMS chip 216 via the conductive glue 232A and the lower electrode layer 214 and have another end electrically connected to the conductive traces 208 in the substrate 202 via the conductive glue 232B. In another embodiment, the ASIC chip 234 may be directly integrated to the MEMS chip for forming system-on-chip (SOC). In other embodiments, the ASIC chip may be integrated into the substrate 202.

Finally, referring to FIG. 8C, a housing 204 is mounted on the surface 203 of the substrate 202 and a cavity 206 is accordingly formed. As such, the MEMS acoustic transducer 200 as shown in FIGS. 2 and 2A is completed. The housing 204 may be fixed on the substrate 202 and electrically connected to the conductive traces 208 via the conductive glue 236. The MEMS chip 216 and the ASIC chip 234 are both disposed in the cavity 206.

FIGS. 8A-8C show a method of fabricating the MEMS acoustic transducer according to an embodiment of the disclosure. For example, a substrate 202 having an opening area 210 is provided first, and then the MEMS chip 216 and the housing 204 are mounted. In addition, in the fabrication of the MEMS chip 216, the dielectric layer 226 and the semiconductor chip 224 could be fabricated, rather than fabricating the backplate as shown in FIG. 1. Thus, the fabricating process can be further simplified, and the time and the cost can be also reduced.

In addition to the fabricating processes illustrated above, the fabricating processes may be also varied by one skilled in the art. For example, the housing may be directly mounted onto the MEMS chip; the conductive glue may be injected after the vertical gap is provided and controlled by the isolation element or the extension portion of the MEMS chip; the upper electrode layer may be mounted on the MEMS chip which is on the substrate after forming the lower electrode layer on the substrate; and/or forms a indentation within the substrate for instead of the cavity formed by the conductive housing and the substrate or MEMS chip.

The MEMS acoustic transducer described above may be applied to various electronic devices. For example, the electronic device may comprise a consumer electronic device, a part of the consumer electronic device, or electronic testing instruments. The consumer electronic device may comprise a cell phone, television, screen, computer, notebook or laptop computer, personal digital assistant, refrigerator, vehicle, stereo set, multimedia player, mp3 player, digital camera, washing machine, tumble, copier, scanner or watch.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A MEMS acoustic transducer, comprising
   a substrate having a first opening area and a lower electrode layer disposed over and directly contacting a surface of the substrate, wherein the first opening area comprises a plurality of holes allowing an acoustic pressure to enter the MEMS acoustic transducer, wherein the lower electrode layer is a single patterned conductive layer;
   a MEMS chip disposed over the surface of the substrate, comprising:
   a second opening area,
   an upper electrode layer partially sealing the second opening area,
   a semiconductor chip having a main portion and an extension portion made of a same material as the main portion, the main portion disposed on a side of the semiconductor chip opposite to the substrate, and the extension portion extending from the main portion to the surface of the substrate and providing a gap between the upper electrode layer and the lower electrode layer, and
   a dielectric layer between the semiconductor chip and the upper electrode,
   wherein the second opening comprising at least one hole through the semiconductor chip and the dielectric layer,
   wherein the upper electrode layer and the lower electrode layer, which are parallel to each other and have a gap therebetween, form an induction capacitor; and
   a housing disposed over the MEMS chip or the surface of the substrate, creating a cavity with the MEMS chip or the substrate.

2. The MEMS acoustic transducer as claimed in claim 1, wherein the substrate comprises an ASIC chip integrated therein.

3. The MEMS acoustic transducer as claimed in claim 1, wherein the MEMS chip comprises an ASIC chip integrated therein.

4. The MEMS acoustic transducer as claimed in claim 1, further comprising an ASIC chip disposed on the surface of the substrate, wherein the ASIC chip has a gap with the MEMS chip.

5. The MEMS acoustic transducer as claimed in claim 1, wherein the upper electrode layer is a vibration membrane, and the lower electrode layer is a rigid layer.

6. The MEMS acoustic transducer as claimed in claim 1, wherein the upper electrode is a rigid layer, and the lower electrode layer is a vibration membrane.

7. The MEMS acoustic transducer as claimed in claim 1, further comprising an isolation element between the MEMS chip and the surface of the substrate, wherein the isolation element provides a gap and an electrical connection between the upper electrode layer and the lower electrode layer.

8. A method of fabricating a MEMS acoustic transducer, comprising
   providing a substrate having a first opening area and a lower electrode layer disposed over and directly contacting a surface of the substrate, wherein the first opening area comprises a plurality of holes allowing acoustic pressure to enter the MEMS acoustic transducer, wherein the lower electrode layer is a single patterned conductive layer;
   mounting a MEMS chip over the surface of the substrate, the MEMS chip comprising:
   a second opening area,
   an upper electrode layer partially sealing the second opening area,
   a semiconductor chip having a main portion and an extension portion made of a same material as said main portion, the main portion disposed on a side of the semiconductor chip opposite to the substrate, and the extension portion extending from the main portion to the surface of the substrate and providing a gap between the upper electrode layer and the lower electrode layer, and
   a dielectric layer between the semiconductor chip and the upper electrode,
   wherein the second opening comprising at least one hole through a semiconductor chip and a dielectric layer,
   wherein the upper electrode layer and the lower electrode layer, which are parallel to each other and have a gap therebetween, form an induction capacitor; and
   mounting a housing over the MEMS chip or the surface of the substrate, creating a cavity with the MEMS chip or the substrate.

9. The method as claimed in claim 8, wherein the substrate comprises an ASIC chip integrated therein.

10. The method as claimed in claim 8, wherein the MEMS chip comprises an ASIC chip integrated therein.

11. The method as claimed in claim 8, further comprising forming an ASIC chip having a gap with the MEMS chip over the surface of the substrate before mounting the housing.

12. The method as claimed in claim 8, wherein the upper electrode layer is a vibration membrane, and the lower electrode layer is a rigid layer.

13. The method as claimed in claim 8, wherein the upper electrode is a rigid layer, and the lower electrode layer is a vibration membrane.

14. The method as claimed in claim 8, further comprising forming an isolation element capable of providing an electrical connection between the upper electrode and the lower electrode layer on the MEMS chip or the substrate before mounting the MEMS chip over the substrate.

* * * * *